United States Patent
Bea et al.

(10) Patent No.: US 8,058,939 B2
(45) Date of Patent: Nov. 15, 2011

(54) SLOPE COMPENSATION CIRCUIT

(75) Inventors: Sung-Hoon Bea, Nowon-gu (KR); Hwan Cho, Goyang-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 46 days.

(21) Appl. No.: 12/641,956

(22) Filed: Dec. 18, 2009

(65) Prior Publication Data

US 2010/0164563 A1    Jul. 1, 2010

(30) Foreign Application Priority Data

Dec. 30, 2008    (KR) .................. 10-2008-0137261

(51) Int. Cl.
*H03K 3/02*  (2006.01)
*H03K 4/08*  (2006.01)
*H03K 7/08*  (2006.01)

(52) U.S. Cl. ........ 331/150; 331/111; 327/132; 327/134; 327/172; 332/110

(58) Field of Classification Search .................. 327/132, 327/134, 172; 331/111, 143, 150; 332/106, 332/109, 110; 375/238, 239
See application file for complete search history.

(56) References Cited

U.S. PATENT DOCUMENTS

| | | | | |
|---|---|---|---|---|
| 3,613,112 | A * | 10/1971 | Kanter .......................... | 341/136 |
| 5,335,162 | A * | 8/1994 | Martin-Lopez et al. ........ | 363/97 |
| 5,498,995 | A * | 3/1996 | Szepesi et al. ................ | 327/538 |
| 6,369,665 | B1 * | 4/2002 | Chee et al. .................... | 331/143 |
| 6,819,154 | B2 * | 11/2004 | Greenfeld ..................... | 327/172 |
| 6,930,520 | B2 * | 8/2005 | Solie ............................. | 327/131 |
| 7,317,362 | B2 * | 1/2008 | Sakuma et al. ............... | 331/111 |
| 7,420,431 | B2 * | 9/2008 | Hwang et al. ................. | 331/143 |
| 2009/0154543 | A1 * | 6/2009 | Jin ................................. | 375/238 |

* cited by examiner

*Primary Examiner* — Levi Gannon
(74) *Attorney, Agent, or Firm* — Sherr & Vaughn, PLLC

(57) ABSTRACT

A slope compensation circuit includes an oscillator for generating a first clock signal having a reference frequency, a ramp signal generator for generating a ramp signal having a duty ratio of about 50% or higher based on the first clock signal, and a slope compensation signal generator for outputting a slope compensation current based on the ramp signal.

15 Claims, 5 Drawing Sheets

US 8,058,939 B2

SLOPE COMPENSATION CIRCUIT

The present application claims priority under 35 U.S.C. §119 to Korean Patent Application No. 10-2008-0137261 (filed on Dec. 30, 2008), which is hereby incorporated by reference in its entirety.

BACKGROUND

A Direct Current-Direct Current (DC-DC) converter can operate by voltage mode control or current mode control depending on its feedback scheme. The current mode control scheme is one of switch mode power supply control systems that are usefully applied. Advantageously, the current mode control makes it possible to realize a simple system compensation circuit. For example, compensation can be implemented with a single compensation capacitor and resistor. Accordingly, system characteristics can be achieved to the same effect as operating as a system having one pole. Other advantages with the current mode control are excellent characteristics of line regulation that is the capability of maintaining a constant output voltage despite changes to an input voltage, and good noise immunity.

However, a system having a duty ratio exceeding 50% for a Pulse Width Modulation (PWM) signal needs a linear or non-linear circuit. This is called a slope compensation circuit. The additional use of a slope compensation circuit can prevent sub-harmonic oscillation.

FIG. 1 is a block diagram of DC-DC converter 100 that operates in a current mode control scheme.

As illustrated in FIG. 1, DC-DC converter 100 includes slope compensation circuit 110 for slope compensation.

FIG. 2A illustrates an inductor (L) current in a DC-DC converter without a slope compensation circuit and FIG. 2B illustrates an inductor (L) current ($I_L$) in a DC-DC converter with a slope compensation circuit. A solid line represents an ideal inductor current and a dotted line represents a real inductor current.

As illustrated in FIGS. 2A and 2B, the DC-DC converter with a slope compensation circuit demonstrates a stable inductor waveform.

SUMMARY

Embodiments are related to a data reception apparatus, and particularly a slope compensation circuit for preventing harmonic oscillation in a system using a PWM signal with a duty ratio of 50% or higher.

In accordance with embodiments, a slope compensation circuit can include at least one of the following: an oscillator for generating a first clock signal having a reference frequency, a ramp signal generator for generating a ramp signal having a duty ratio of about 50% or higher based on the first clock signal, and a slope compensation signal generator for outputting a slope compensation current based on the ramp signal.

In accordance with embodiments, a slope compensation circuit can include at least one of the following: an oscillator configured to generate a waveform of a reference frequency; a ramp signal generator configured to generate a ramp signal based on the first clock signal; and a slope compensation signal generator configured to output a slope compensation current based on the ramp signal.

DRAWINGS

Figure 1:
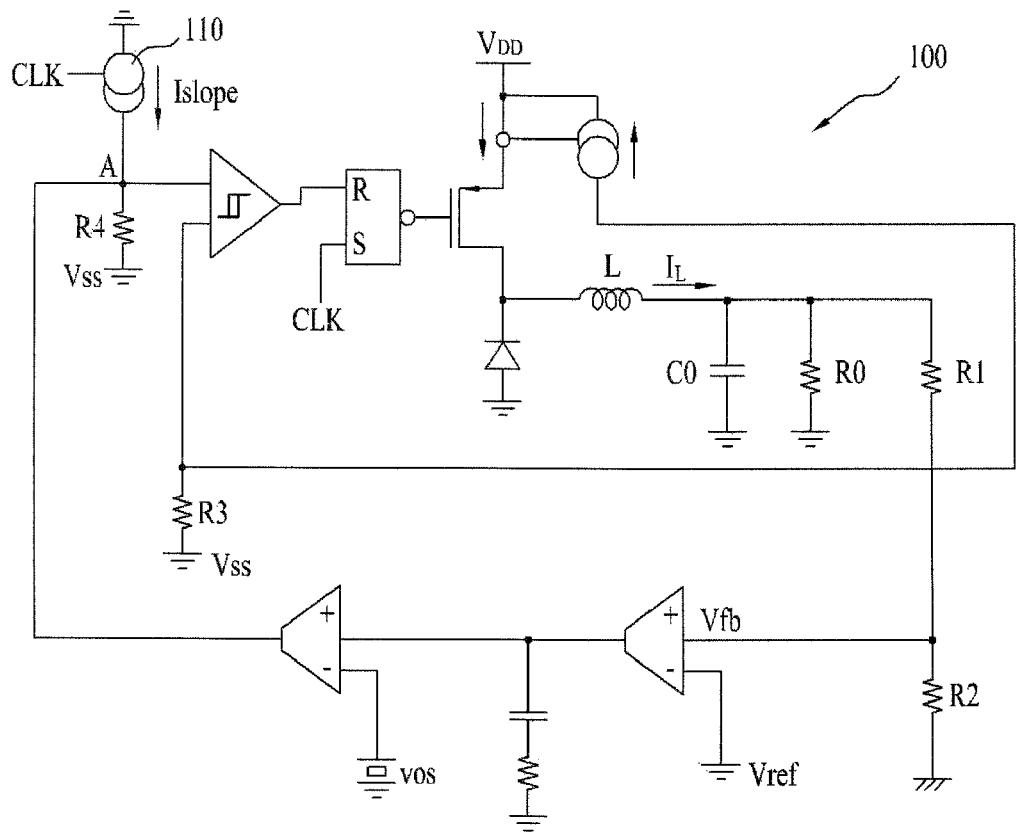
FIG. 1 illustrates a DC-DC converter that operates in a current mode control scheme.
Figure 2A:
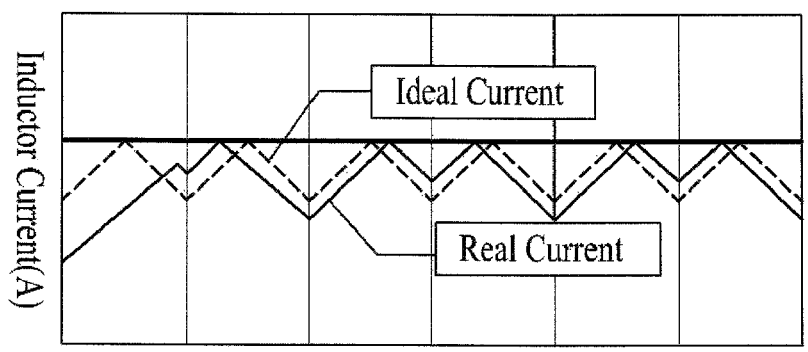
FIGS. 2A and 2B illustrate an inductor current in a DC-DC converter without a slope compensation circuit and an inductor current in a DC-DC converter with a slope compensation circuit.
Figure 2B:
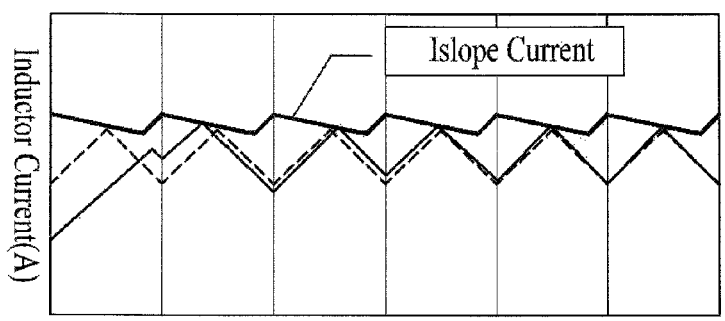

Example FIGS. 3 to 8 illustrate a slope compensation circuit and an oscillator, in accordance with embodiments.

DESCRIPTION

Reference will now be made in detail to embodiments, examples of which are illustrated in the accompanying drawings. Wherever possible, the same reference numbers will be used throughout the drawings to refer to the same or like parts.

It is to be noted that while reference characters $V_{DD}$ and $V_{SS}$ denote power voltages in their general use, they represent first and second power supplies, respectively herein.

Figure 3:
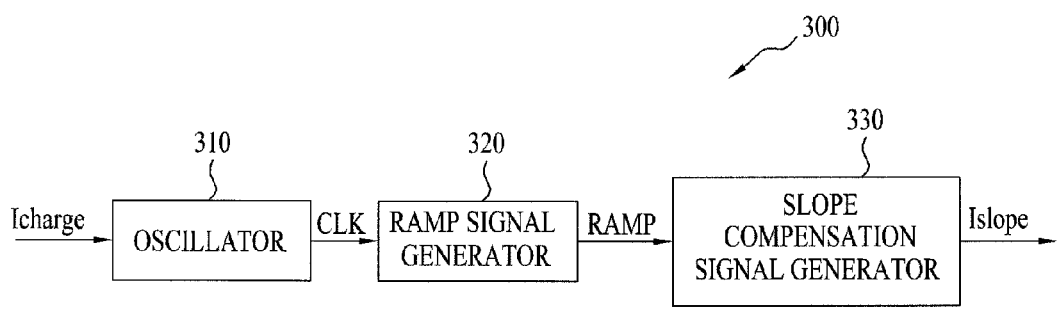

Example FIG. 3 is a block diagram illustrating slope compensation circuit 300 in accordance with embodiments.

As illustrated in example FIG. 3, slope compensation circuit 300 includes oscillator 310, ramp signal generator 320, and slope compensation signal generator 330. Oscillator 310 generates the waveform of a reference frequency. Oscillator 310, which is used for an analog circuit, can generate a waveform having the reference frequency using a reference current source and a capacitor.

Figure 4:
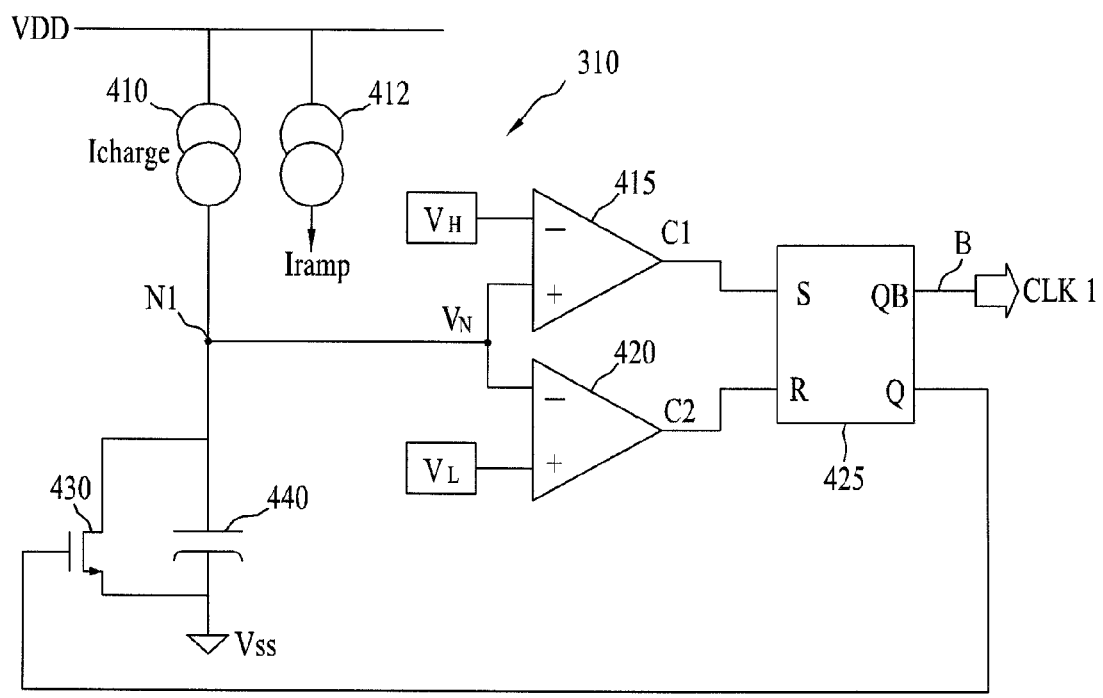

Example FIG. 4 is a circuit diagram illustrating oscillator 310 as illustrated in example FIG. 3.

As illustrated in example FIG. 4, oscillator 310 includes current source 410, current mirror 412, first comparator 415, second comparator 420, RS flip-flop 425, first transistor 430, and first capacitor 440. Current source 410 is connected between first power supply VDD and first node N1 and supplies current Icharge to first node N1. Current mirror 412 mirrors current Icharge supplied from current source 410 and outputs mirrored current Iramp.

First comparator 415 includes a first terminal (i.e., a (−) input terminal) for receiving first reference voltage $V_H$ and a second terminal (i.e. a (+) input terminal) connected to first node N1. First comparator 415 compares first reference voltage $V_H$ with voltage $V_N$ from first node N1, and outputs the comparison result as first comparison signal C1. Second comparator 420 includes a first terminal (i.e. a (−) input terminal) connected to first node N1 and a second terminal (i.e. a (+) input terminal) for receiving second reference voltage $V_L$. Second comparator 420 compares second reference voltage $V_L$ with voltage $V_N$ from first node N1, and outputs the comparison result as second comparison signal C2.

RS flip-flop 425 includes set terminal S for receiving first comparison signal C1 and reset terminal R for receiving second comparison signal C2 and outputs first and second outputs Q and QB based on first and second comparison signals C1 and C2.

First transistor 430 is connected between first node N1 and second power supply $V_{SS}$ and includes a gate to which first output Q is applied. First capacitor 440 is connected between first node N1 and second power supply $V_{SS}$. Meaning, first transistor 430 and first capacitor 440 are connected in parallel between first node N1 and second power supply $V_{SS}$.

Figure 5:
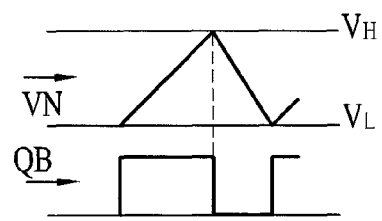

Example FIG. 5 illustrates the waveforms of voltage $V_N$ of first node N1 and second output QB of RS flip-flop 425 illustrated in example FIG. 4.

As illustrated in example FIGS. 4 and 5, voltage $V_N$ of first node B1 takes the form of a ramp signal that rises and falls between first and second reference voltages $V_H$ and $V_L$, along with charge and discharge of first capacitor 440. Second output QB has a clock waveform having a rising edge or a down edge at a timing when voltage $V_N$ of first node N1 is equal to first reference voltage $V_H$ or second reference voltage $V_L$. Hereinafter, second output QB is referred to as first clock signal CLK1. Ramp signal generator 320 generates a ramp signal RAMP having a duty ratio of 50% or higher based on first clock signal CLK1.

Figure 6:
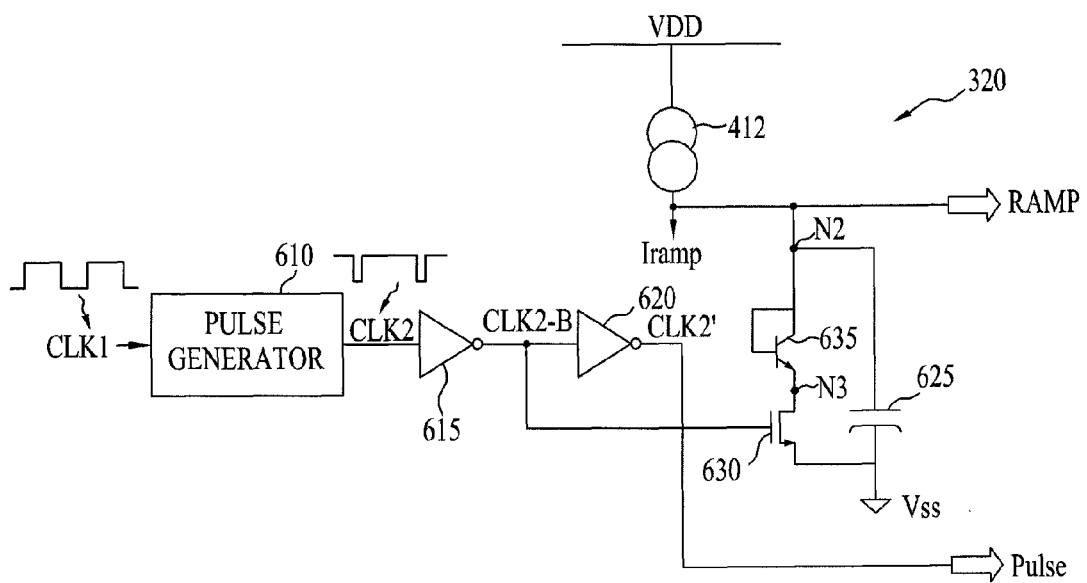

Example FIG. 6 is a circuit diagram illustrating 1 ramp signal generator 320 illustrated in example FIG. 3.

As illustrated in example FIG. 6, ramp signal generator 320 includes pulse generator 610, first inverter 615, second inverter 620, second capacitor 625, first switch 630, and load diode 635. Pulse generator 610 changes only the duty ratio of first clock signal CLK1 without changing the frequency of first clock signal CLK1 and outputs the duty ratio-changed first clock signal as second clock signal CLK2. For example, pulse generator 610 may change the duty ratio of first clock signal CLK1 to a:1 (i.e., 9:1).

First inverter 615 inverts second clock signal CLK2 and outputs the inverted second clock signal CLK2-B. Second inverter 620 inverts inverted second clock signal CLK2-B again and outputs the resulting clock signal CLK' having the same phase as that of second clock signal CLK2. Second capacitor 625 is connected between second node N2 and second power supply $V_{SS}$. Current Iramp mirrored by current mirror 412 is supplied to second node N2. First switch 630 is connected between second power supply $V_{SS}$ and third node N3 and switches in response to the inverted second clock signal CLK2-B. For example, first switch 630 may be an N-type Metal Oxide Semiconductor (NMOS) transistor which is connected between second power supply $V_{SS}$ and third node N3 and has a gate for receiving the inverted second clock signal CLK2-B. Load diode 635, which is connected between second node N2 and third node N3, may be a transistor having a source and a gate that are connected to each other. Load diode 635 functions to prevent a threshold voltage-incurred switching delay of first switch 630.

When first switch 630 switches off, second capacitor 625 is charged with current Iramp mirrored by current mirror 412. When first switch 630 switches on, the voltage charged in second capacitor 625 is discharged to second power supply $V_{SS}$ through load diode 635 and first switch 630.

Figure 7:
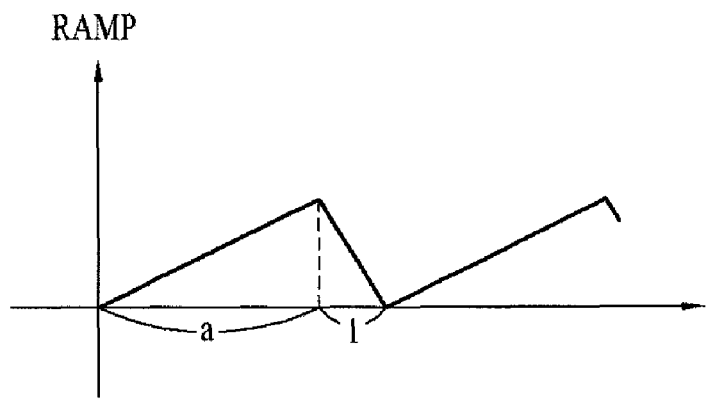

Example FIG. 7 illustrates the waveform of voltage RAMP of second node N2 illustrated in example FIG. 6.

As illustrated in example FIG. 7, a:1 represents the duty ratio of voltage RAMP of second node N2. Slope compensation signal generator 330 outputs slope compensation current Islope based on voltage RAMP of second node N2. Slope compensation signal generator 330 is a type of voltage-current converter.

Figure 8:
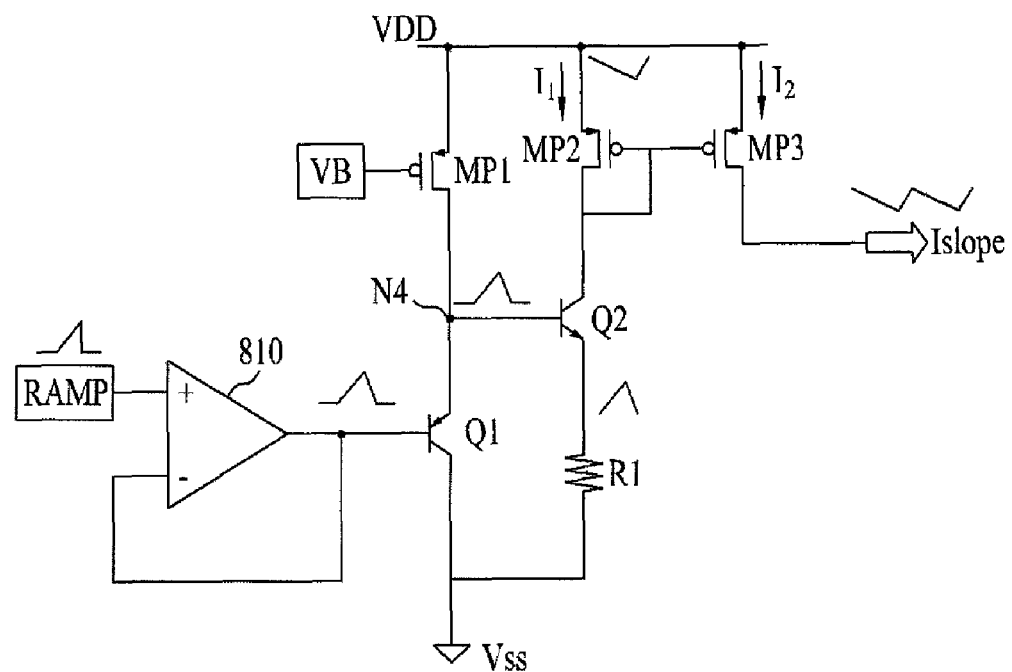

Example FIG. 8 is a circuit diagram illustrating slope compensation signal generator 330 illustrated in example FIG. 3.

As illustrated in example FIG. 8, slope compensation signal generator 330 includes buffer 810, first bipolar transistor Q1, second bipolar transistor Q2, resistor R1, first bias transistor MP1, and current mirrors MP2 and MP3. Buffer 810 buffers the voltage of second node N2 and outputs the buffered voltage. Bias transistor MP1 is connected between first power supply $V_{DD}$ and fourth node N4 and includes a gate for receiving bias voltage $V_B$. First bipolar transistor Q1 is connected between second power supply $V_{SS}$ and fourth node N4 and includes a base for receiving the output of buffer 810. Second bipolar transistor Q2 has a base connected to fourth node N4. Resistor R1 is connected between second power supply $V_{SS}$ and an emitter of second bipolar transistor Q2.

Current mirrors MP2 and MP3 are connected between first power supply $V_{DD}$ and a collector of second bipolar transistor Q2. Current mirrors MP2 and MP3 mirror a first current I1 flowing between first power supply $V_{DD}$ and the collector of second bipolar transistor Q2 and output a second, mirrored current I2 as slope compensation current Islope. Slope compensation current Islope having an appropriate value can be generated by use of first bipolar transistor Q1, second bipolar transistor Q2, and resistor R1. In case of an ideal slope compensation, the slope compensation current preferably has a non-linear inclination rather than a first-order inclination. A linear or non-linear slope compensation current Islope can be generated by controlling the value of resistor R1.

The voltage of second node N2, RAMP, the voltage input to the base of first bipolar transistor Q1, the voltage of fourth node N4, and the voltage supplied to resistor R1 have waveforms with phases of the same polarity. On the other hand, first current I1 has a waveform with a phase of an opposite polarity and second current I2 and the slope compensation current have waveforms with phases having the same polarity as that of first current I1. Consequently, the slope compensation current Islope has a waveform with a phase of an opposite polarity to that of voltage RAMP of second node N2. For instance, slope compensation current Islope may have a waveform with a phase of an opposite polarity to that of voltage RAMP of the second node.

As voltage RAMP is converted to current Islope through bipolar transistors Q1 and Q2 having fast responses, slope compensation circuit 300 is available to a device requiring fast operation, such as an Active Matrix Organic Light Emitting Diode (AMOLED) power supply system.

As is apparent from the above description, the slope compensation circuit in accordance with embodiments generates a ramp signal by use of an oscillator and generates a slope compensation current using the ramp signal. Therefore, harmonic oscillation is prevented in a system using a PWM signal having a duty ratio of 50% or higher.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
an oscillator configured to generate a first clock signal having a reference frequency;
a ramp signal generator configured to generate a ramp signal having a duty ratio of 50% or higher based on the first clock signal; and
a slope compensation signal generator configured to output a slope compensation current based on the ramp signal,
wherein the ramp signal generator comprises:
a pulse generator configured to change the duty ratio of the first clock signal and output the duty ratio-changed first clock signal as a second clock signal;
a second current source configured to supply a second current to a second node;
a capacitor connected between the second node and a ground;
a second switch connected between the ground and a third node and configured to switch in response to the second clock signal; and
a load diode connected between the second node and the third node.

2. The apparatus of claim 1, wherein the oscillator comprises:
a capacitor connected to a first node;
a first current source for supplying a first current to the first node;
a first comparator configured to output a first comparison signal according to a result of comparing a first reference voltage with a voltage of the capacitor connected to the first node;
a second comparator configured to output a second comparison signal according to a result of comparing a second reference voltage with the voltage of the capacitor connected to the first node;

an RS flip-flop configured to output a non-inverted output and the first clock signal being an inverted output based on the first and second comparison signals; and a first switch configured to switch in order to at least one of charge the capacitor with the first current or discharge a voltage of the charged capacitor based on the non-inverted output.

3. The apparatus of claim 1, wherein a voltage of the second node is the ramp signal.

4. The apparatus of claim 3, wherein the second current source supplies a mirrored current of the first current as the second current to the second node.

5. The apparatus of claim 4, wherein the pulse generator changes the duty ratio of the first clock signal to 9:1 and outputs the first clock signal with the duty ratio 9:1 as the second clock signal.

6. The apparatus of claim 4, further comprising:
an inverter configured to invert the second clock signal and provide the inverted second clock signal to the second switch.

7. The apparatus of claim 6, wherein the second switch switches in response to the inverted second clock signal.

8. The apparatus of claim 1, wherein the slope compensation signal generator comprises:
a bias transistor connected between a first power supply and a fourth node, the bias transistor including a gate configured to receive a bias voltage;
a first bipolar transistor connected between a second power supply and the fourth node, the first bipolar transistor including a base configured to receive the ramp signal;
a second bipolar transistor having a base connected to the fourth node;
a resistor connected between an emitter of the second bipolar transistor and the second power supply; and
a current mirror connected between a collector of the second bipolar transistor and the first power supply, the current mirror configured to mirror a current flowing between the first power supply and the collector of the second bipolar transistor and output the mirrored current as the slope compensation current.

9. The apparatus of claim 8, wherein the slope compensation current has a linear inclination according to a value of the resistor.

10. The apparatus of claim 8, wherein the slope compensation current has a non-linear inclination according to a value of the resistor.

11. The apparatus of claim 8, wherein the slope compensation signal generator further comprises a buffer configured to buffer the ramp signal and output the buffered ramp signal to the base of the first bipolar transistor.

12. An apparatus comprising:
an oscillator configured to generate a waveform of a reference frequency;
a ramp signal generator configured to generate a ramp signal based on the waveform; and
a slope compensation signal generator configured to output a slope compensation current based on the ramp signal, wherein the oscillator comprises:
a current source connected between a first power supply and a first node, the current source configured to supply a current to the first node;
a current mirror configured to mirror the current supplied from the current source and output the mirrored current;

a first comparator including a first terminal configured to receive a first reference voltage and a second terminal connected to first node;
a second comparator including a third terminal connected to the first node and a fourth terminal configured to receive a second reference voltage;
an RS flip-flop including a set terminal configured to receive a first comparison signal and a reset terminal configured to receive a second comparison signal and output first and second outputs based on the first and second comparison signals;
a first transistor connected between the first node and a second power supply, the first transistor including a gate to which the first output is applied; and
a first capacitor connected between the first node and the second power supply,
wherein the ramp signal generator comprises:
a pulse generator configured to change the duty ratio of the first clock signal and output the duty ratio-changed first clock signal as a second clock signal;
a second current source configured to supply a second current to a second node;
a capacitor connected between the second node and a ground;
a second switch connected between the ground and a third node and configured to switch in response to the second clock signal; and
a load diode connected between the second node and the third node.

13. The apparatus of claim 12, wherein:
the first comparator is configured to compare the first reference voltage with a voltage from the first node and output the comparison result as a first comparison signal; and
the second comparator is configured to compare the second reference voltage with the voltage from the first node and output the comparison result as a second comparison signal.

14. The apparatus of claim 12, wherein the first transistor and the first capacitor are connected in parallel between the first node and the second power supply.

15. The apparatus of claim 12, wherein the slope, compensation signal generator comprises:
a bias transistor connected between a first power supply and a fourth node, the bias transistor including a gate configured to receive a bias voltage;
a first bipolar transistor connected between a second power supply and the fourth node, the first bipolar transistor including a base configured to receive the ramp signal;
a second bipolar transistor having a base connected to the fourth node;
a resistor connected between an emitter of the second bipolar transistor and the second power supply; and
a current mirror connected between a collector of the second bipolar transistor and the first power supply, the current mirror configured to mirror a current flowing between the first power supply and the collector of the second bipolar transistor and output the mirrored current as the slope compensation current.

\* \* \* \* \*